United States Patent [19]
Tomita et al.

[11] Patent Number: 5,369,493
[45] Date of Patent: Nov. 29, 1994

[54] COMPONENT TRANSPORTING APPARATUS AND METHOD

[75] Inventors: Masamichi Tomita, Chiyoda; Kazuo Honma, Ami; Shigemi Igarashi, Ushiku; Tadaaki Ishikawa; Ryu Takizawa, both of Inayoshi; Sotozi Hiramoto, Chiba; Makoto Honma, Funabashi; Seiji Hata, Fujisawa; Mitsuo Nakamura, Sakura, all of Japan

[73] Assignee: Hitachi, Ltd., Tokyo, Japan

[21] Appl. No.: 672,039

[22] Filed: Mar. 19, 1991

[30] Foreign Application Priority Data

Mar. 19, 1990 [JP] Japan ................................. 2-68752
May 18, 1990 [JP] Japan ................................ 2-126661

[51] Int. Cl.⁵ ............................................ G01N 21/64
[52] U.S. Cl. ....................................... 356/400; 356/375
[58] Field of Search .............. 356/138, 150, 375, 399, 356/400; 29/720, 721, 740, 759; 901/47

[56] References Cited

U.S. PATENT DOCUMENTS

| | | | |
|---|---|---|---|
| 4,474,469 | 10/1984 | Abe | 356/399 |
| 4,608,494 | 8/1986 | Kobayashi et al. | 356/400 |
| 4,738,025 | 4/1988 | Arnold | 29/740 |
| 4,973,216 | 11/1990 | Domm | 29/759 |
| 5,030,008 | 7/1991 | Scott et al. | 356/394 |

FOREIGN PATENT DOCUMENTS

| | | |
|---|---|---|
| 135403 | 8/1983 | Japan . |
| 63099 | 4/1986 | Japan . |
| 260280 | 10/1988 | Japan . |

*Primary Examiner*—Richard A. Rosenberger
*Attorney, Agent, or Firm*—Antonelli, Terry Stout & Kraus

[57] ABSTRACT

An apparatus for transporting an electronic component includes a head for holding the component when the component is picked up from a suitable storage device. The head is movable relative to a base with an imaging apparatus being fixed to the head and allowing position of the component relative to the head to be determined while the component is being transported. A movable optical component is provided on the head which, in one position, contributes to defining an optical path between the component and the imaging apparatus, and in another position, is withdrawn. A further imaging apparatus may be provided, on the base or on the head with the further imaging apparatus detecting the position of large components, if the first imaging apparatus has a narrow filed of view for small components. Alternatively, when the further imaging apparatus is on the head, the imaging apparatus may detect the position to which the component is to be transported.

31 Claims, 9 Drawing Sheets

COMPONENT TRANSPORTING APPARATUS AND METHOD

BACKGROUND OF THE INVENTION

The present invention relates to an apparatus and a method for transporting a component and, more particularly, to the transportation of an electronic component from a component storage of such components to a printed circuit board.

SUMMARY OF THE PRIOR ART

Generally, when moving an electronic component from a storage to a printed circuit board, for mounting the component on the circuit board, the apparatus for transporting the component has a head which moves from a component pick-up position to a suitable position adjacent the printed circuit board with suitable means, such as, for example, a suction nozzle, being provided on the head for holding the component. The positioning of the component on the printed circuit board then depends critically on the orientation of the component relative to the head and, if the component is misaligned then the component will not be positioned correctly. Therefore several systems have been proposed for detecting the position of the component relative to the head.

In a conventional apparatus as shown in FIG. 1 an adsorption or suction nozzle 3 of the mounting head 1 of the electronic component mounting apparatus picks up an electronic component 4 from a component storage 15 or 15a with the adsorption nozzle 3 moving to and stopping at the position of an imaging apparatus 2 for detecting the position of the electronic component 4 and deciding whether or not the electronic component 4 is in the correct position relative to the head 1, so that the component 4 can be correctly mounted on a printed circuit board 5. The imaging apparatus 2, in the form of a camera, is located at a position below the path of movement of the adsorption nozzle 3.

A disadvantage of the above described construction resides in the fact that the head 1, on which the electronic component 4 is mounted, must stop when moving to the position of the imaging apparatus or camera 2. Moreover, since the head 1 does not move linearly to the position of the printed circuit board 5 but takes a circuitous route through the position of the imaging apparatus or camera 2, the path of the head 1 contains a detour, so that the time for mounting of the electronic component 4 on to the printed circuit board 5 is lengthened and the efficiency of the mounting of the electronic component 4 is thus decreased.

In Japanese Patent Laid-Open No. 260280/1988, an imaging apparatus (camera) is equipped with a position switch, a strobe and a high speed shutter at a position below the path of movement of the head, so that when the head is located above the position switch, with an electronic component held thereon, the position switch operates, the strobe emits light pulses and the high speed shutter of the camera opens so as to photograph the electronic component.

While the last-mentioned apparatus does not suffer from the problems described above in connection with the apparatus of FIG. 1 because the imaging apparatus or camera takes a photograph of the electronic component during the movement of the head, since the imaging apparatus is separate from the head, the disadvantage of the apparatus resides in the blurring of the subject when the imaging apparatus or camera detects the electronic component if there is any vibration or the like during the movement of the head and, consequently, highly accurate detection is difficult. While this problem may be solved by providing a vibration-proof structure for the mounting head, the provision of such structure is much more complicated thereby increasing the overall costs of the apparatus.

In Japanese Patent Laid-Open No. 63099/1986 the imaging apparatus (camera) is movable and when the head reaches a position above the printed circuit board, with an electronic component, the camera moves to a suitable position and photographs the electronic component and printed circuit board.

The last mentioned apparatus does not suffer the above noted problems with regard to the previously described prior art constructions; however, since the imaging apparatus or camera is integral with the optical components for imaging the electronic components and guiding the image to the imaging apparatus or camera, the camera and the optical components necessary therefore must be relatively large in size in order to detect a large sized electronic component, assuming that the visual field of the imaging apparatus or camera is constant. Therefore, the time of movement of the imaging apparatus or camera is relatively long and, in order to solve this problem, it is necessary to provide an increased driving force for driving the imaging apparatus or camera.

In Japanese Patent Laid-Open No. 63099/1968, the camera has a tube extending therefrom defining the optical path to the camera, with the tube having a beam-splitter at the end of the tube remote from the camera, enabling the camera to simultaneously photograph both the electronic component and the circuit board. That end of the tube is therefore moved to a position directly between the electronic component and the circuit board, normally at equal distances from the component to the circuit board, so that a suitable photograph can be taken.

In Japanese Patent Laid-Open No. 135403/1983, a plurality of cameras are provided above the mounting head, for photographing the electronic component and the printed circuit board.

Additional proposals for detecting the position of the component relative to the electronic head are disclosed in U.S. Pat. No. 4,286,201, an article entitled "A Compact Image Process and its Application", S. Hacker et al., Proceedings of the 14th Annual Conference of IEEE Industrial Electronics Society, an article entitled "A Manufacturing Solution For Surface Mount Component High-Accuracy and High Volume Placement", R. S. Shand, Conference Proceedings of the Robots No. 12 and Vision 88 Conference, and an article entitled "Vision Applications of a Direct Drive Robot", J. L. Morris, 5th International Conference on Robot Vision and Sensory Controls.

The present invention provides an apparatus and method for transporting a component, such as an electronic component, which permits improved detection of the location of the component relative to the transportation head.

In accordance with the present invention, the imaging apparatus, preferably a camera, is provided on the head.

According to the present invention, the imaging apparatus is fixed to the head, and there is an optical component which is movable between a position in which it contributes to defining an optical path between the imaging apparatus and the component mounted on the head, and another position in which it is withdrawn. The imaging apparatus is fixed, and only the optical component moves relative to the head so that the mechanism necessary for moving that optical component may be relatively simple. With such an arrangement, when the component is picked up by the head, the optical component may be in its withdrawn position so it does not interfere with the picking up of that component, and it may then be moved to a position defining an optical path between the imaging apparatus and the component on the head, and check that the component is in the correct position relative to the head. Then, the optical component may be withdrawn so that it does not subsequently interfere with the processing of the component, for example, the mounting of that component on a printed circuit board.

In accordance with further features of the invention, a second imaging apparatus, such as a camera, may be provided with the first camera having a narrow field of view and the other camera having a wide field of view thereby providing a number of possibilities. First, the two imaging apparatuses, for example, cameras, may be used to check the position of components of different sizes, so that the imaging apparatus with a narrow field of view detects small components where high precision is needed, and the imaging apparatus with a wide field of view detects large components. In this case, the imaging apparatus with the wide field of view may be on the head or on the base of the apparatus. If, however, the imaging apparatus with a wide field of view is positioned on the head, it could alternatively be used to detect the point to which the component on the head is to be moved, such as the printed circuit board.

In accordance with still further features of the present invention a second imaging apparatus, for example, a camera may be used with the second imaging apparatus being mounted on the base of the apparatus.

It should be noted that a given component transporting apparatus according to the present invention may embody one or more of the above-described features.

BRIEF DESCRIPTION OF THE DRAWINGS

Embodiments of the present invention will now be described in detail, by way of example, with reference to the accompanying drawings, wherein.

DETAILED DESCRIPTION

Figure 2:
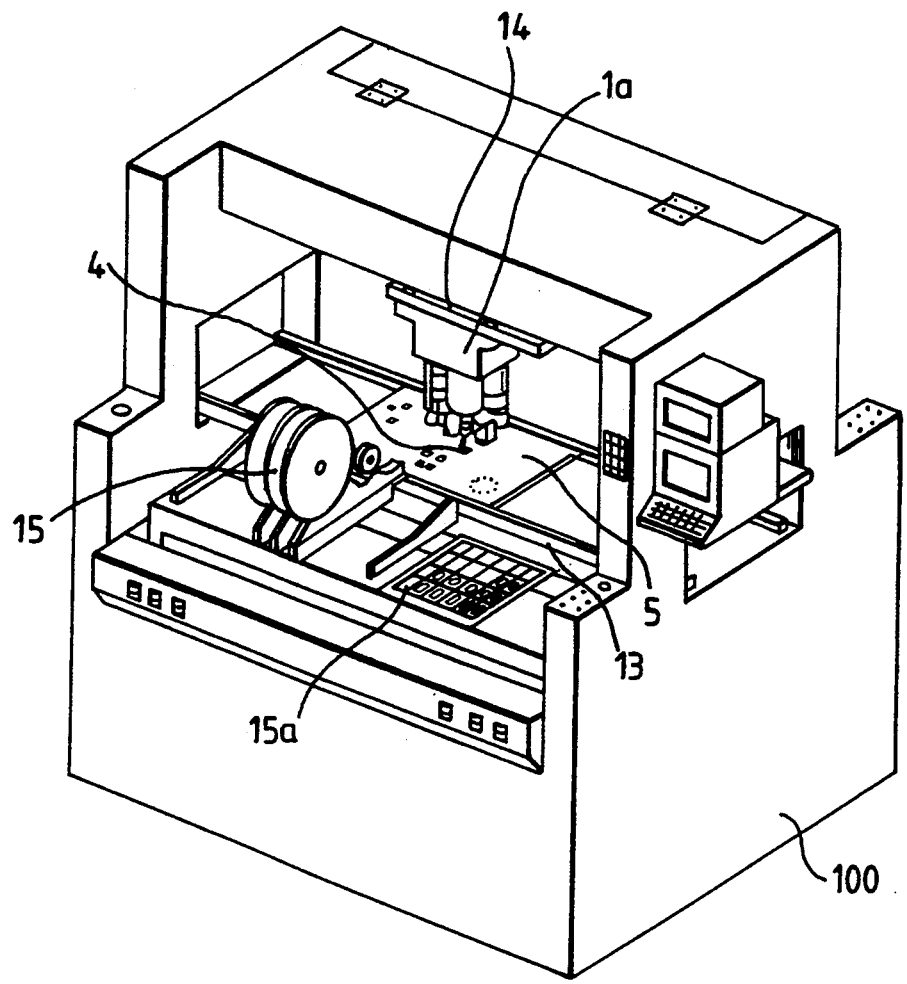
FIG. 2 is a schematic perspective view of a transportation apparatus constructed in accordance with the present invention.
Figure 3:
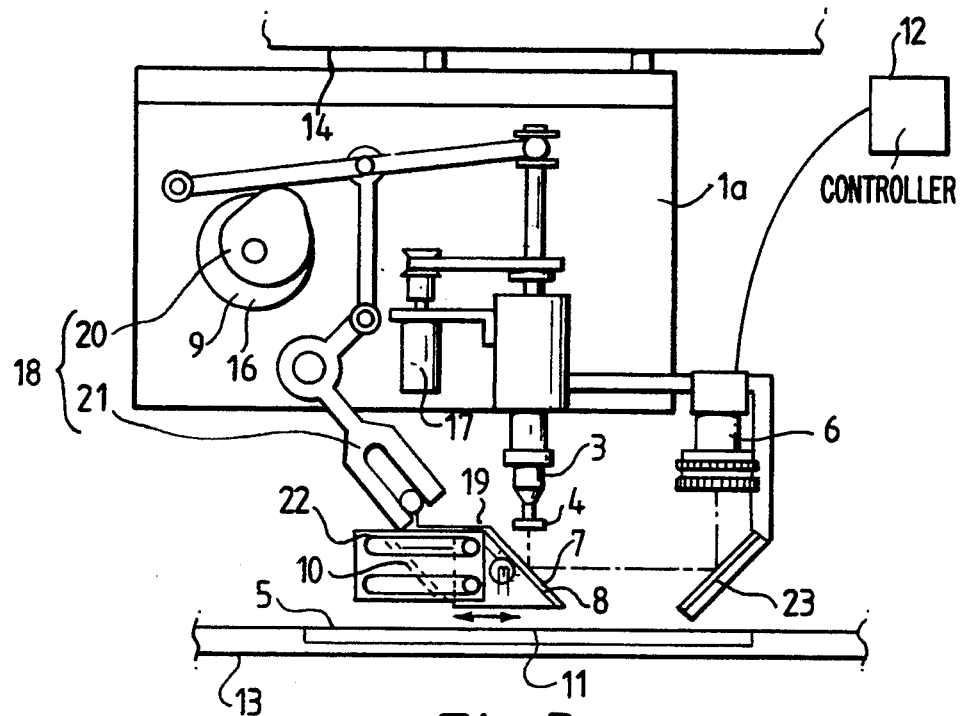
FIG. 3 is a schematic detail view of a first embodiment of a transportation apparatus according to the present invention.

Referring now to the drawings wherein like reference numerals are used throughout the various views to designate like parts and, more particularly, to FIGS. 2 and 3, according to these figures, an electronic component transporting apparatus includes a base 100, and an electronic storage device 15 and/or component storage device 15a is provided, with various electronic components 4 being stored in the storage device 15 or component storage device 15a. A printed circuit board 5 is horizontally fixed onto a conveyor 13, with a head 1a being mounted over the printed circuit board 5 and being operated by a suspension type two-axis Cartesian coordinate robot 14 having its X- and Y-axes in a plane parallel to a surface of the printed circuit board 5, for example, in a horizontal plane. One electronic component 4 is withdrawn from the electronic component storage device 15 or 15a by adsorption due to suction by an adsorption or suction nozzle 3 and the component 4 is transferred to the printed circuit board 5.

In the construction of FIG. 3, the head 1a supports the adsorption nozzle 3, a driving device 16 moves the nozzle 3 vertically in the Z axis, and a driving device 17 rotates the nozzle 3 around a center axis thereof. An imaging apparatus or camera 6 is provided along with an optical component 8 which, in FIG. 3, lies on an extension of the axis of the nozzle 3 and has a reflection surface 7. A driving device 9 moves the optical component 8 relative to the imaging apparatus 6, and a transmission device 18 is provided. An illumination device 19 illuminates the electronic component 4 near the optical component 8 or the nozzle 3.

In this embodiment, the driving device 16 for the vertical motion of the nozzle 3 and the driving device 9 for the relative motion of the optical component 8 are the same. Furthermore, a plane mirror inclined at 45° to the axis of the nozzle 3, is used as the optical component 8.

When the image of the electronic component 4 is taken, a cam 20 of the transmission device 18 is rotated by the operation of the driving device 9 on an instruction from a controller 12 of the electronic component transporting apparatus, a link mechanism 21 swings, slides the optical component 8 along a slide rail 22 and positions the reflection surface 7 previously on the extension of the axis of the nozzle 3 so as to define an optical path between the electronic component 4 and the imaging apparatus 6, via a second optical component 23 also having a reflection surface.

When the electronic component 4 is picked up from the electronic component supply device 15 or 15a and mounted onto the printed circuit board 5, the driving device 9 operates similarly under instruction from the controller 12 of the electronic component mounting apparatus and withdraws the optical component 8 to a position clear of the extension of the axis of the nozzle 3, or, in other words, it causes parallel motion in the horizontal direction. The nozzle 3 may then be lowered in synchronism with the parallel motion due to rocking of the link mechanism 21 and, in this position, a component 4 may be picked up by the nozzle 3 or mounted on the printed circuit board 5.

In this embodiment, the vertical motion of the adsorption nozzle 3 and the motion of the optical component 8 can be made in the interlocking arrangement with each other by the same driving device. Therefore, both of these motions can be reliably synchronized and there is no possibility that the nozzle 3 and the optical component 8 will interfere with each other. Since the object which moves is the optical component 8, which is light in weight and since its operation stroke is small, a rapid, reciprocating motion can be made at the time of imaging and this is very effective for reducing the time for mounting the component 4 on the board 5.

Figure 4:
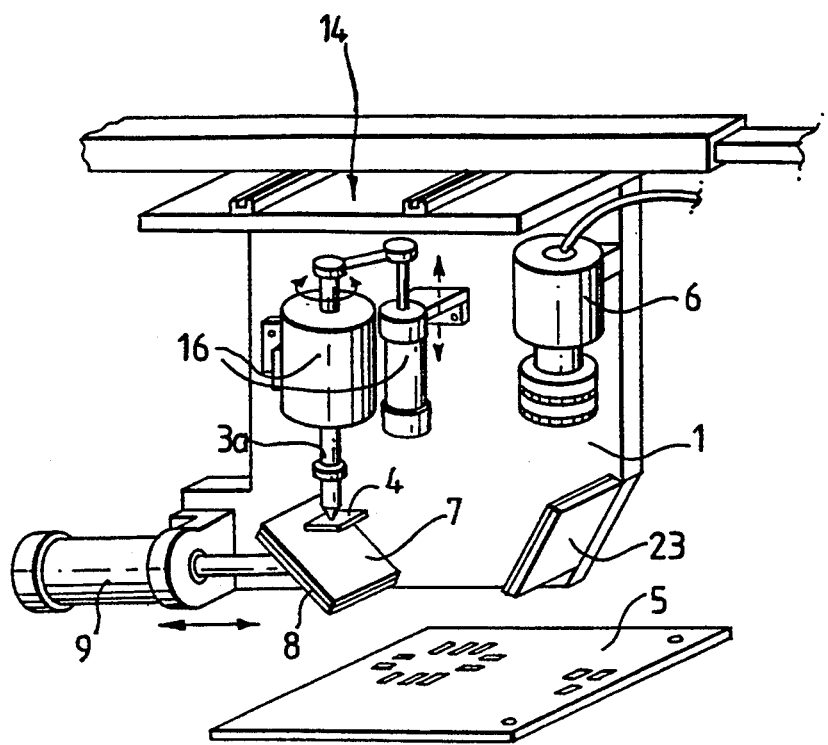
FIG. 4 is a schematic view of a second embodiment of the transportation apparatus according to the present invention.

In the embodiment of FIG. 4, the mechanism for moving the optical component 8 and the mechanism for moving the nozzle 3 are separate. Apart from this, other components may be the same as in the first embodiment and will not be discussed in detail. In FIG. 4, it can be seen that the optical component 8 is mounted at the end of a piston rod of a piston 9, which moves the optical component 8 parallel to the plane of the printed circuit board 5. This movement permits the optical component 8 to be moved from the position shown in FIG. 4, in which it contributed to defining an optical path between the component 4 on a nozzle 3a and the imaging apparatus (camera) 6 via the optical component 8 and the further reflection surface 23, and withdrawn position in which it is clear of the extension of the axis of the nozzle 3a. The nozzle 3a is driven by a suitable driving device 16, which permits both vertical and rotational movement. The embodiment of FIG. 4 has a relatively simple construction, but the timing of the movement due to driving device 9 and driving device 16 must be synchronized.

Figure 5:
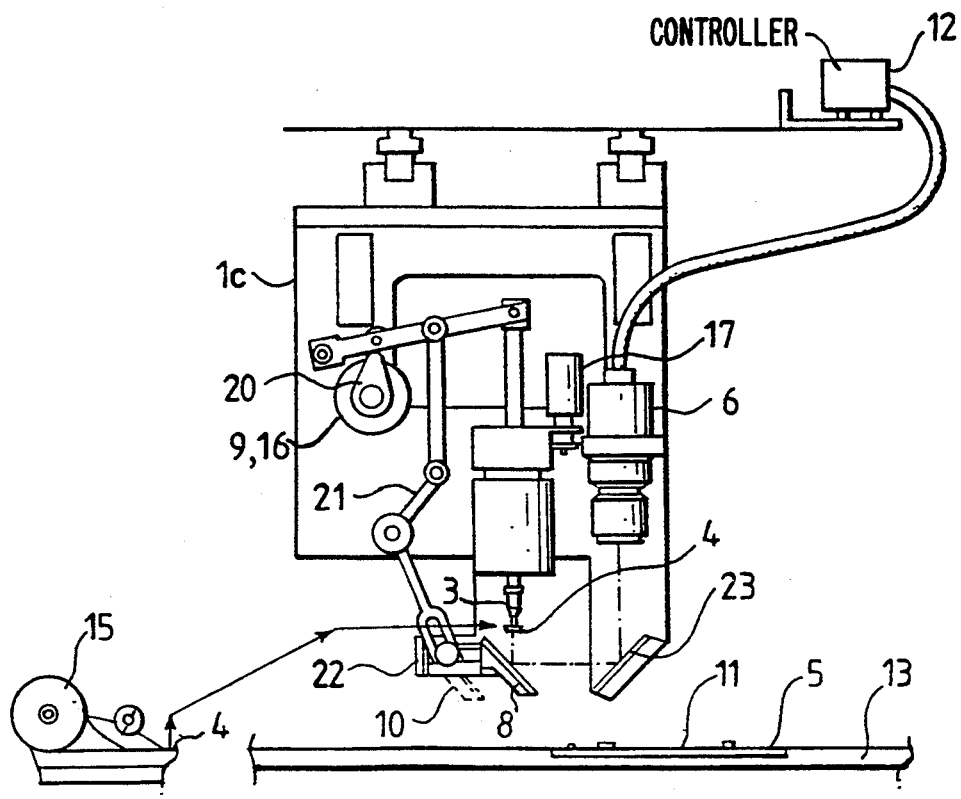
FIG. 5 is a schematic view of a third embodiment of the present invention.

FIG. 5 shows another embodiment of the present invention, which is substantially similar to the embodiment in FIG. 3, except that there has been some geometrical re-organization of the components. FIG. 5 also shows the storage device 15 of the components 4.

In each of the embodiments of FIGS. 2-5, the head 1a, 1b, 1c moves immediately above an electronic component storage device 15 and the nozzle 3 is lowered and vacuum draws one electronic component 4 into the end of the nozzle 3. At this time, the optical component 8 having a reflection surface 7 is in a withdrawn position 10 (FIGS. 3 and 5), that is, to one side of the nozzle 3 where it does not impede the operation of the nozzle 3. The nozzle 3 rises and the head 1a, 1b or 1c moves linearly above the mounting target position 11 (FIGS. 3 and 5) on the surface of the printed circuit board 5 and transfers the electronic component 4. During the transfer operation, the optical component 8 is positioned on the extension of the axis of the nozzle 3 and an image of the electronic component 4 can thus be seen by imaging apparatus 6.

The imaging apparatus 6 photographs the image of the electronic component 4 under instruction from the controller 12 of the imaging apparatus, determines whether the component 4 is correctly positioned on the nozzle 3 and measures the deviation ($\Delta X$, $\Delta Y$, $\Delta \theta$) of the position (X,Y) and the posture ($\theta$) of the electronic component 4 with respect to the head 1a, 1b or 1c.

The optical component 8 is then again withdrawn to its withdrawn position 10 and the head stops at a suitable position, found by correcting the rotary angle round the axis of the nozzle 3 calculated on the basis of the image recognition result and adding the position correction distance in the X- and Y- directions calculated similarly to the original instruction position. Then, the nozzle 3 is lowered, mounts the electronic component 4 onto the printed circuit board 5 and thus completes the mounting operation of one electronic component 4.

Figure 6:
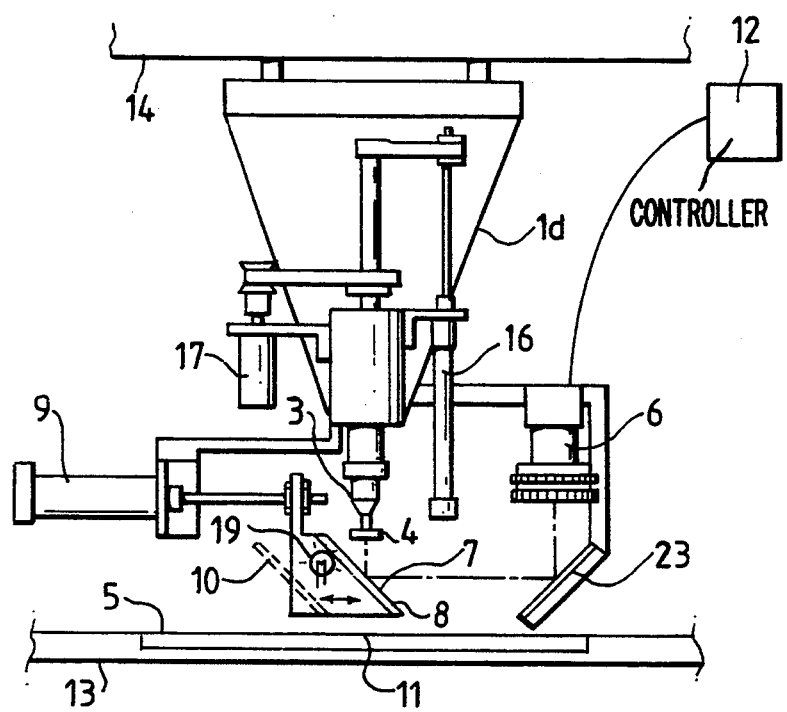
FIG. 6 is a schematic view of a fourth embodiment of the present invention.

In the embodiment of FIG. 6, the driving device 16 for the vertical motion of the adsorption nozzle 3 and the driving device 9 for the motion of the optical component 8 are separate from each other and the controller 12 of the electronic component transporting apparatus generates the instructions to both driving devices 9 and 16 on the basis of a predetermined sequence so as to make the similar vertical motion and retreating motion. It is then similar to the second embodiment.

The embodiment of FIG. 4 and the embodiment of FIG. 6 have the advantage that head 1b or 1d can be compact because a cam and a complicated transmission mechanism are not necessary.

Figure 7:
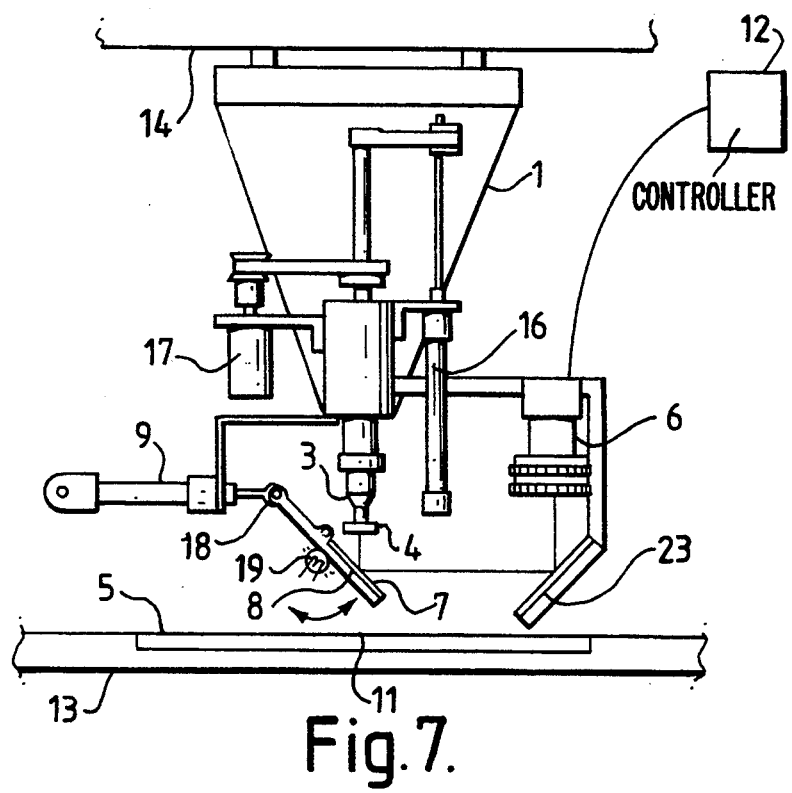
FIG. 7 is a schematic view of a fifth embodiment of the present invention.

In the embodiment of FIG. 7, the driving device 16 for the vertical motion of the adsorption nozzle 3 and the driving device 9 for the motion for the optical component 8 are again separate from each other. The operation of the driving device 9, for linear motion or rotation is converted to rotation through a transmission device 18, is transmitted to the optical component 8 and carries a retreating motion (withdrawal) of the reflection surface 7 relative to the axis of the nozzle 3.

The embodiment of FIG. 7 provides the advantage of accomplishing the withdrawal of the optical component 8 by a reciprocating motion or rotary motion of the driving device 9 with a short stroke. It is possible to combine the cam 20 of the first embodiment with the rotary withdrawal system of this embodiment.

This embodiment uses a steel belt 24 in place of the link mechanism used in the embodiment of FIGS. 2 and 3. A link 21 is connected to the driving device 16 through the cam 20 separately from the cam and the link for moving the nozzle 3 vertically. The steel belt 24 is connected to the free end of the link 21 and the optical component 8 is connected to the other end of the steel belt 24 which is bent around a pulley fixed to the head 1.

Figure 8:
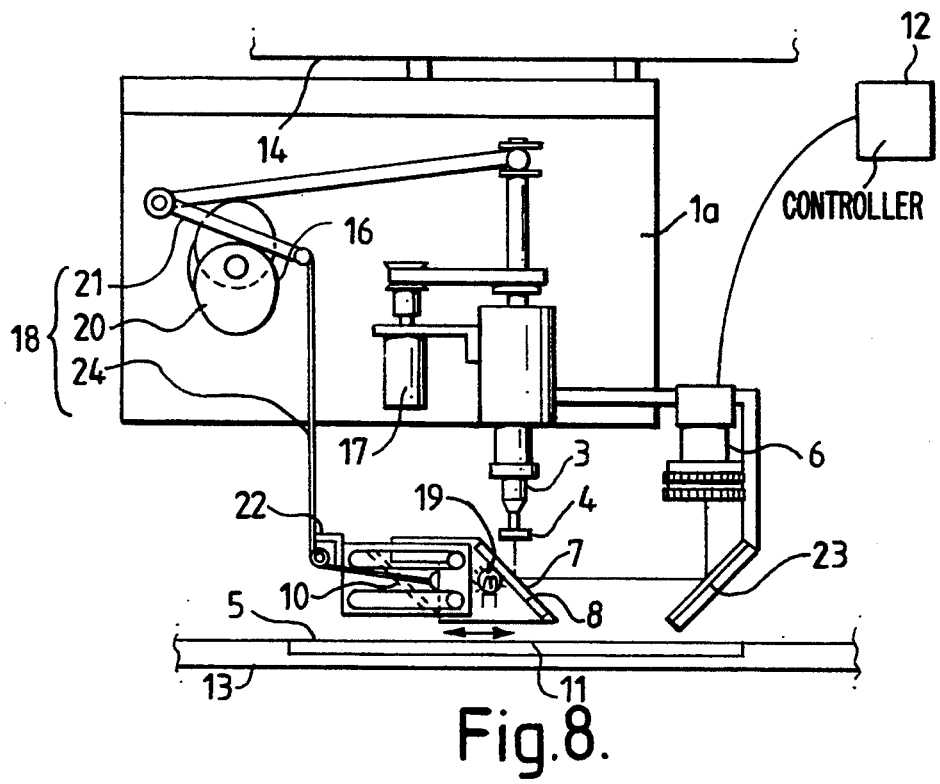
FIG. 8 is a schematic view of a sixth embodiment of the present invention.

In addition to the advantages obtained by the embodiments of FIGS. 2 and 3 the embodiment of FIG. 8 provides the advantage that the transmission device 18 can be constructed compactly, using the cam 20, the link 21 and the steel belt 24.

Figure 9:
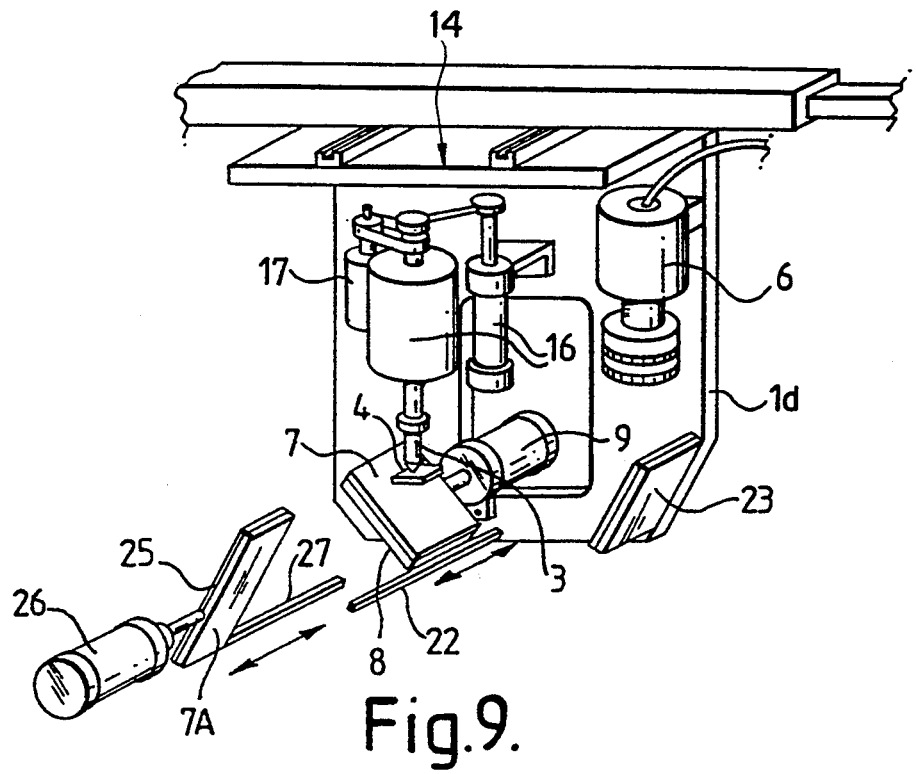
FIG. 9 is a schematic view of a seventh embodiment of the present invention.

In the embodiment of FIG. 9, the nozzle 3 for drawing the electronic component 4, the driving device 16 for the vertical motion of the nozzle 3 and the driving device 17 for rotation of the nozzle 3 are provided on the head 1d. Movable optical components 8 and 25, having respective reflection surfaces 7 and 7A, are mounted on the extension of the axis of the nozzle 3, and there is the driving device 9 for the motion of the optical component 8, a driving device 26 for the optical component 25, and slide rails 22 and 27, with the optical component 23 being fixed to the head 1d and the imaging apparatus (camera) 6 fixed to the head 1d.

An image of the electronic component 4 is generated at the imaging apparatus 6, there then being an optical path between the component 4 and the imaging apparatus 6, via the further end indicated and optical components 8 and 23, on the extension of the axis of the nozzle 3. That image is generated during the transfer operation of the 2-axis Cartesian coordinate robot 14. Other types of robot, for example, Selective Assembly Robot Arm type robot or (SCARA type robot) or a cylindrical co-ordinate robot, can be employed in the present invention. Next, after the nozzle 3 is positioned immediately above the mounting target position 11, (FIG. 3) the pattern being the mounting target position of the electronic component on the surface of the printed circuit board 5 or a mark existing at a predetermined position near the mounting target position is photographed with the optical component 25. The driving devices 9 and 26 are operated to withdraw the optical component 8 and to move the optical component 25 so that it is aligned with the optical component 23, to define an optical path between the circuit board 5 and the imaging apparatus 6.

Alternatively, the plurality of patterns or marks described above that are printed on the printed circuit board 5 may be photographed before the electronic component 4 is adsorbed.

Figure 10:
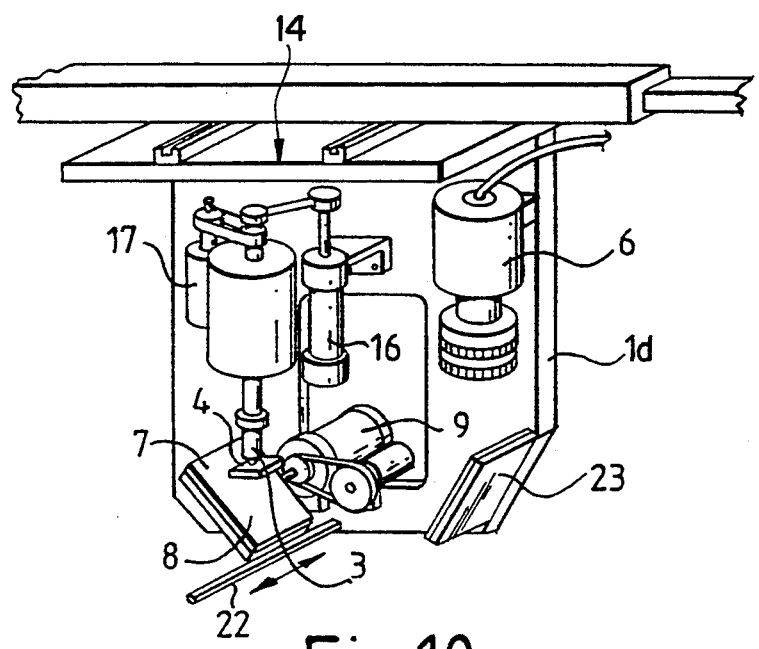
FIG. 10 is a schematic view of an eighth embodiment of the present invention.

In the embodiment of FIG. 9, the direction of movement of the optical components 8 and 25 along the slide rails 22 and 27 is perpendicular to the direction of the optical path to the imaging apparatus 6 in a horizontal plane. It is also possible to rotate the optical component 8 having one reflection surface as shown in FIG. 10 instead of having separate optical components 8 and 25.

In accordance with the embodiment of FIG. 9, the image of the electronic component 4 can be obtained during the transfer operation, the head 1d need not stop once at a predetermined position for the purpose of photographing and only the optical component 8 having the reflection surface is withdrawn.

Figure 1:
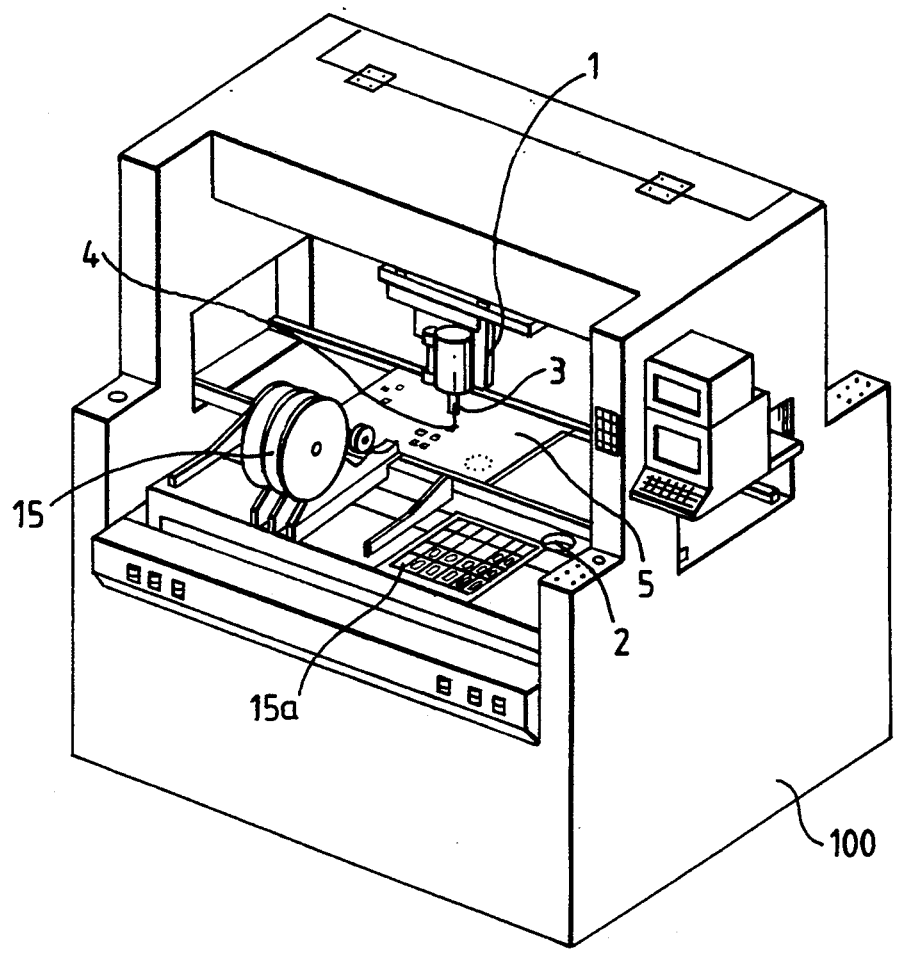
FIG. 1 is a schematic perspective view of a conventional apparatus for transporting an electrical component.

Therefore, this retreating motion can be made within a short period and the total time necessary for mounting the electronic component can be reduced. Furthermore, since the images of the patterns or marks around the periphery of the mounting target position 11 of the printed circuit board 5 can be obtained by the imaging apparatus 6 fixed to the head 1d which is stopped immediately above the mounting target position 11 either immediately before, or in advance of, the mounting of the electronic component, the relative displacement to be corrected between the head 1 and the target position 11 of the printed circuit board 5 can be determined directly. Accordingly, there is the advantage that the accuracy or otherwise of the suspension type robot 14 does not influence the photographing of the printed circuit board 5 and the use of that photographed image to determine the movement of the nozzle 3 to achieve correct mounting of the component 4 unlike the known apparatus shown in FIG. 1 wherein the mounting head 1 is stopped at another position to photograph the electronic component or the apparatus of Japanese 63099/1986 wherein the optical axis of the imaging apparatus is brought into alignment with the mounting target position 11 in order to photograph the printed circuit board 5.

The embodiment of FIG. 9 provides a further advantage, namely that one imaging apparatus 6 can generate the image of the electronic component 4 as well as the images of the patterns or marks.

All the above-described embodiments relate to an apparatus for transporting a component having a single camera, which camera was mounted on the head; however, it is also possible in accordance with the present invention to utilize two imaging devices or cameras.

Figure 11:
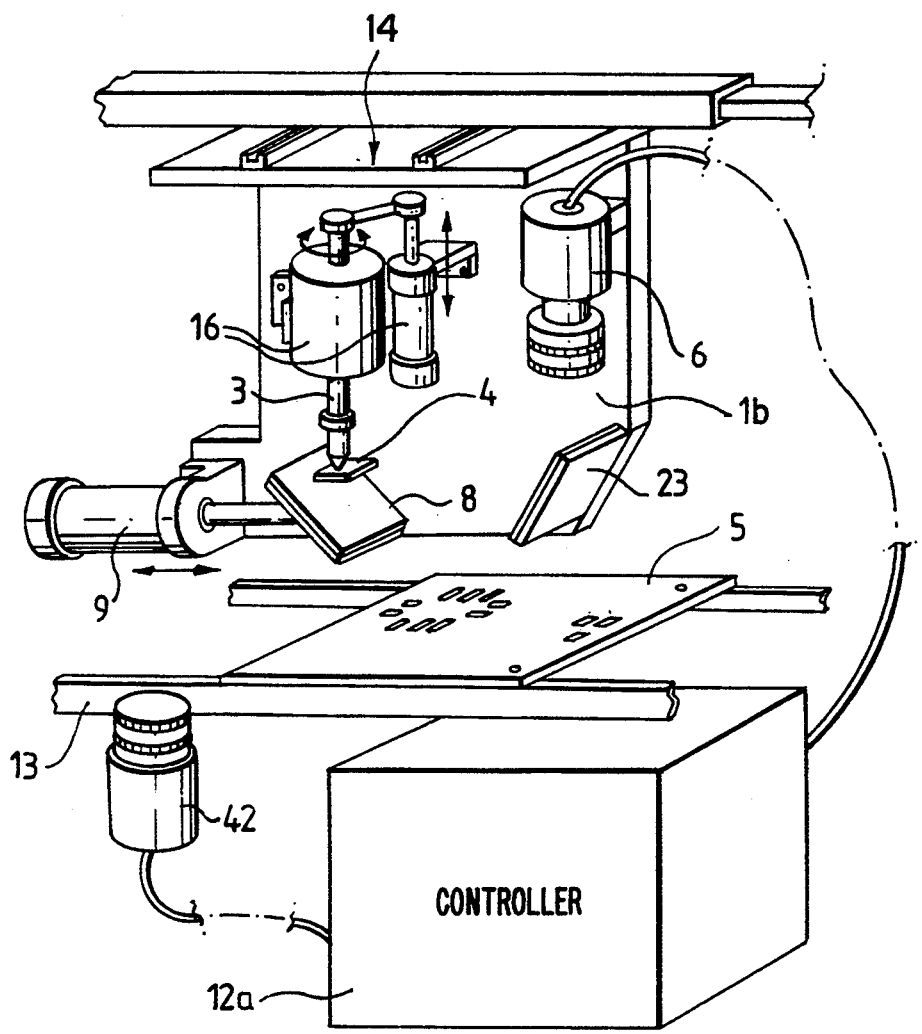
FIG. 11 is a schematic view of a ninth embodiment of the present invention.

More particularly as shown in FIG. 11, a first imaging device (camera) 6 is mounted on a head 1b and in fact, the imaging device 6, the nozzle 3 which holds an electronic component 4, the optical components 8 and 23, and the drive mechanisms 9 and 16 are arranged in the same manner as in the embodiment of FIG. 4.

However, unlike the previous embodiments, a second imaging device (camera) 42 is positioned next to the conveyor 13 which supports the printed circuit board 5. The imaging device 42 may be the same as the conventional imaging apparatus in camera 2 of FIG. 1. However, as can be seen from FIG. 11, the two imaging apparatus 6 and 42 are connected to a common controller 12A, which enables either or both of these imaging apparatuses 6, 42 to observe to electronic component 4. Preferably, the first imaging apparatus 6 has a narrow field of view, and the second imaging apparatus 42 has a wide field of view. Then, if a small electronic component 4 is picked up by the nozzle 3, a detailed picture of the electronic component may be obtained using the imaging apparatus 6, which views the electronic component 4 via the optical components 8 and 23.

If, on the other hand, the electronic component 4 is large, then the field of view of the imaging apparatus 6 may be too narrow to observe the entire electronic component. In such a case, the head 1b may be moved so that the electronic component 4 is above the second imaging apparatus 42, the optical component 8 withdrawn using the driving device 9, and the electronic component 4 may then be observed by the second imaging apparatus 42. The detection of the position of such a large electronic component, relative to the head 1b is then the same as in the known systems with reference to FIG. 1. However, with the embodiment of FIG. 11, there is the advantage that a more precise measurement of the position of the smaller electronic component 4 can be obtained than is possible in the prior art, because the first imaging apparatus 6 may be used for such a small electronic component 4.

The use of imaging apparatuses 6, 42, with different fields of view may be used in conjunction with the provision of storage devices for different sized components. This can be seen referring to FIG. 1, in which the storage device 15 is for small electronic components and the storage device 15a is for large electronic components. If the second imaging apparatus 42 is located proximate the storage device 15a for the large electronic components, in the same way that the imaging apparatus 2 is located near the storage device 15a in FIG. 1, then the head 1 needs to move a large electronic component only by a short distance before it can be observed by the second imaging apparatus 42.

Where electronic components are stored in different storage devices depending on the size of the electronic component, then the controller 12a may coordinate the detection of the position of each electronic component relative to the head 1 in dependance upon the storage device 15, 15a from which that electronic component 4 has been picked up by the nozzle 3 of the head 1.

In the embodiment of FIG. 11, the imaging apparatus (camera) 6 with a narrow field of view is mounted on the head 1b, and the imaging apparatus 42 with a wide field of view is mounted on the base 100. However, it is also possible for both imaging apparatuses 6, 42 to be mounted on the head 1b, as shown in FIG. 12.

Figure 12:
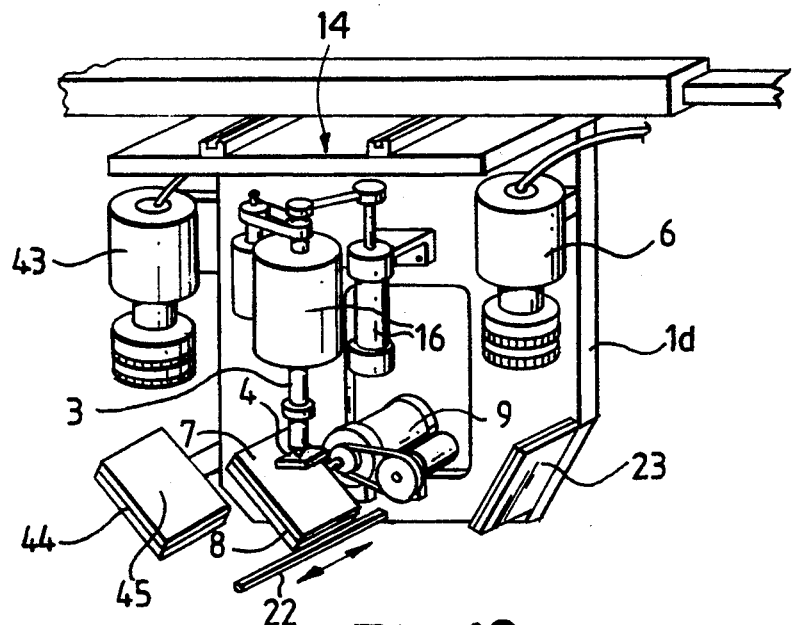
FIG. 12 is a schematic view of a tenth embodiment of the present invention.

In FIG. 12, a second imaging apparatus 43 is mounted on the head, with a third optical component 44 being mounted below that imaging apparatus 43, which optical component 44 has a reflection surface 45 which directs the direction of view of the imaging apparatus 43 towards the electronic component 4. In FIG. 12, the optical component 8 is rotatable about an axis in its plane, as well as movable linearly parallel to that axis.

In FIG. 12, if the electronic component 4 is small, the detection of its position is as in the previous embodiments. Thus, the imaging apparatus 6 detects the location of the electronic component 4 on the nozzle 3, via the optical components 8 and 23. If, however, the electronic component 4 is too large to be observed by the imaging apparatus 6 (assuming that imaging apparatus 6 has a narrow field of view), then the optical component 8 is rotated about an axis in its plane, so that it turns through substantially 90° in a counter-clockwise direction in FIG. 12. When the optical component 8 is in that position, the second imaging apparatus 43 may observe the position of the component 4 on the nozzle 3 via the third optical component 44 and the first optical component 8. If the second imaging apparatus 43 has a wide field of view, large components may the be observed. When the position of the electronic component 4 on the nozzle 3 has been observed by either the first or second imaging apparatuses 6, 43, then the optical component 8 may be moved linearly in its plane, along rail 22, so that it is clear of the axis of the nozzle 3, and the electronic component 4 may be lowered onto a printed circuit board 5.

The embodiment of FIG. 12 gives the same advantage as the embodiment of FIG. 11, namely, that the position of different sized electronic components may be measured accurately, but it also has the advantage that, since the second imaging apparatus 43 is mounted on the head 1, there is less risk of a poor image due to image shake, and also there is no delay while the head 1d moves to the position of the second imaging apparatus 42, as in the embodiments of FIG. 11.

Figure 13:
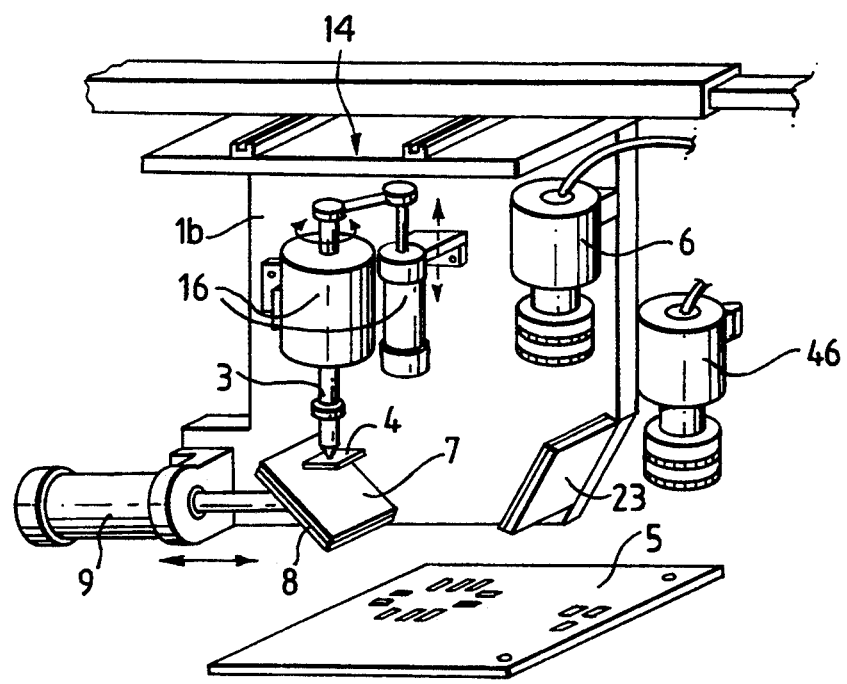
FIG. 13 is a schematic view of a eleventh embodiment of the present invention.

In the embodiments of FIGS. 11 and 12, a second imaging apparatus (camera) is provided for observing large electronic components. In the embodiment of FIG. 13, a second imaging apparatus (camera) is provided but, in this case, the second imaging apparatus is for observing the printed circuit board.

In FIG. 13, the arrangement of the first imaging apparatus (camera) 6 is mounted on the head 1b in the same as in the embodiment of FIG. 4.

However, FIG. 13 also shows a second imaging apparatus (camera) 46 which is mounted on the head 16 and is directed downwardly so that it may observe the printed circuit board 5. Thus, this camera 46 may observe the exact position of the head 1b relative to the printed circuit board 5, to increase the precision of positioning of the electronic component 4 on the printed circuit board 5 when the electronic component 4 is lowered onto the printed circuit board 5. Thus, the embodiment of FIG. 13 is related to the embodiment of FIG. 9, and, in a similar way, patterns or marks may be provided on the printed circuit board 5, to assist in the determination of the position of the head 16 above a suitable target position.

Figure 14:
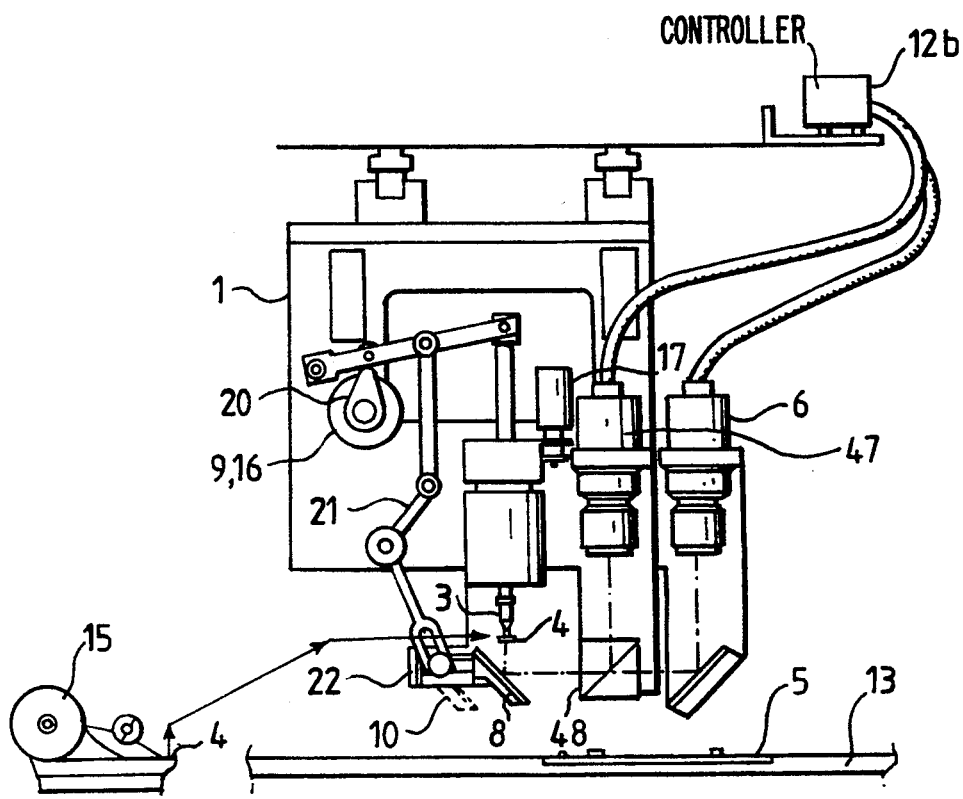
FIG. 14 is a schematic view of a twelfth embodiment of the present invention.

An arrangement which combines the advantages of the embodiments of FIGS. 11 and 12 is shown in FIG. 14 wherein a second imaging apparatus 47, and a beam splitter 48 are provided with the second imaging apparatus (camera) 47 observing the electronic component 4 via the beam splitter 48 and the first optical component 8, while the first imaging apparatus (camera) 6 observes the electronic component 4 via the optical component 23, the beam splitter 48, and the first optical component 8. Thus, the controller 12B may select the appropriate imaging apparatus 6, 47 in dependence upon the size of the electronic component 4 without any physical movement of the optical components 8, 23 or beam splitter 48, since the beam splitter 48 permits an image of the electronic component 4 to be generated simultaneously at the first and second imaging apparatuses 6, 47. Therefore, the embodiment of FIG. 14 has the advantage that, independent of the size of the electronic component 4, its position relative to the nozzle 3 may be determined rapidly because the controller 12a will select only the appropriate signals from the first and second imaging apparatuses 6, 47 for further processing.

By suitable design of the beam splitter 48, either the first or second imaging apparatus 6, 48 may be used to observe the printed circuit board 5. The beam splitter 48 may permit light to pass directly from the printed circuit board 5 to the second imaging apparatus 47, or may direct light from the printed circuit board 5 to the optical component 23, and then to the first imaging apparatus 6. Again, no physical movement of the optical components 8, 23, the beam splitter 48, or the imaging apparatuses 6, 47 is necessary.

Thus, in accordance with the present invention, transfer of the electronic component and detection of displacement (position) of an electronic component can be simultaneously executed. Accordingly, the head need not stop at a predetermined position for the purpose of photographing the electronic component (except possibly if that component is large) and the electronic component can be transferred through the shortest path. The optical components are lighter in weight and need a shorter alignment time for positioning, as compared with the known technique which moves the optical system as a whole inclusive of the imaging apparatus 6 and the like, and, for this reason, the retreating or withdrawing operation can be made at a higher speed. Thus, a shortening of the total time for mounting the electronic component can be obtained.

Since the imaging apparatus (camera) fixed to the head directly measures the displacement of the electronic component with respect to the nozzle, the position error of the head at the time of photographing does not affect the measurement result and accuracy of the mounting position can be improved.

What is claimed is:

1. An apparatus for transporting a component, the apparatus comprising:

a base;

a head movable relative to said base;

holding means on said head for holding said component, wherein movement of said head relative to said base in a first direction causes a transportation of said component relative to said base when said component is held by said holding means;

an imaging means fixed on said head for optically investigating said component when said component is held by said holding means;

at least one optical component on said head for defining an optical path between said imaging means and said component when said component is held by said holding means, wherein said imaging means is fixed to said head, and said at least one optical component is movable relative to said imaging apparatus between an operating position in which said optical path is defined between said imaging apparatus and said component when said component is held by said holding means and a withdrawn position, and wherein a further imaging means is fixed to said base for investigating said component when said component is held on the holding means in a predetermined position relative to said base.

2. An apparatus for transporting a component, the apparatus comprising:

a base;

a head movable relative to said base;

holding means on said head for holding said component, wherein movement of said head relative to said base in a first direction causes a transportation of said component relative to said base when said component is held by said holding means;

an imaging means fixed on said head for optically investigating said component when said component is held by said holding means; and at least one optical component on said head for defining an optical path between said imaging means and said component when said component is held by said holding means, wherein said imaging means is fixed to said head, and said at least one optical component is movable relative to said imaging apparatus between an operating position in which said optical path is derided between said imaging apparatus and said component when said component is held by said holding means and a withdrawn position, said imaging means has a narrow angle of view, and wherein said apparatus further comprises a further imaging means having a wide angle of view for investigating said component when said component is held by said holding means.

3. An apparatus for transporting a component, the apparatus comprising:

a base;

a head movable relative to said base;

holding means on said head for holding said component, wherein movement of said head relative to said base in a first direction causes a transportation of said component relative to said base when said component is held by said holding means;

an imaging means fixed on said head for optically investigating said component when said component is held by said holding means; and at least one optical component on said head for defining an optical path between said imaging means and said component when said component is held by said holding means;

wherein said imaging means is fixed to said head, and said at least one optic component is movable relative to said imaging apparatus between an operating position in which said optical path is defined between said imaging apparatus and said component when said component is held by said holding means and a withdrawn position, said imaging means has a narrow angle of view, and wherein said apparatus further comprises a further imaging means having a wide angle of view for investigating said component when said component is held by said holding means, and said further imaging means is fixed to said base.

4. An apparatus for transporting a component, the apparatus comprising:

a base;

a head movable relative to said base;

holding means on said head for holding said component, said holding means including a nozzle, wherein movement of said head relative to said base in a first direction causes a transportation of said component relative to said base when said component is held by said holding means:

an imaging means fixed on said head for optically investigating said component when said component is held by said holding means: and only one optical component on said head for defining an optical path between said imaging means and said component when said component is held by said holding means, and wherein said imaging manes is fixed to said head, and said one optical component is movable relative to said imaging means between an operating position in which said optical path is defined between said imaging means and said component when said component is held by said holding means and a withdrawn position, wherein said optical component is linearly movable in a plane substantially perpendicular to said first direction, and further including a linkage mechanism between said optical component and said holding means for simultaneously moving said optical component and said holding means by a single actuator.

5. An apparatus for transporting a component, the apparatus comprising:

a base;

a head movable relative to said base;

holding means on said head for holding said component, wherein movement of said head relative to said base in a first direction causes a transportation of said component relative to said base when said component is held by said holding means;

an imaging means fixed on said head for optically investigating said component when said component is held by said holding means; and at least one optical component on said head for defining an optical path between said imaging means and said component when said component is held by said holding means, and wherein said imaging means is fixed to said head, and said at least one optical component is movable relative to said imaging apparatus between an operating position in which said optical path is defined between said imaging apparatus and said component when said component is held by said holding means and a withdrawn position, said at least one optical component is rotatable between said operating position and said withdrawn position, and wherein a further imaging means is fixed to said base for investigating said component when said component is held on the holding means in a predetermined position relative to said base.

6. An apparatus for transporting a component, the apparatus comprising:

a base;

a head movable relative to said base;

holding means on said head for holding said component, wherein movement of said head relative to said base in a first direction causes a transportation of said component relative to said base when said component is held by said holding means;

an imaging means fixed on said head for optically investigating said component when said component is held by said holding means; and at least one optical component on said head for defining an optical path between said imaging means and said component when said component is held by said holding means, and wherein said imaging means is fixed to said head, and said at least one optical component is movable relative to said imaging apparatus between an operating position in which said optical path is defined between said imaging apparatus and said component when said component is held by said holding means and a withdrawn position, said imaging means has a narrow angle of view, and wherein a further imaging means having a wide angle of view is provided for investigating said component when said component is held by said holding means.

7. An apparatus according to claim 6, wherein said further imaging means is fixed to said base.

8. An apparatus according to claim 7, wherein said first direction intersects said at least one optical component when said at least one optical component is in said operating position.

9. An apparatus according to claim 7 further comprising a linkage between said at least one optical component and said holding means for simultaneously moving said at least one optical component and said holding means.

10. An apparatus for transporting a component, the apparatus comprising:
a base;
a head movable relative to said base;
holding means on said head for holding said component, said holding means includes a nozzle, wherein movement of said head causes a transportation of said component relative to said base when said component is held by said holding means;
an imaging means on said head for optically investigating said component when said component is held on said holding means, said imaging means having a narrow angle of view;
only one optical component on said head for defining an optical path between said imaging apparatus and said component when said component is held by said holding means; and
a further imaging means having a wide angle of view for investigating said component when said component is held by said holding means.

11. An apparatus according to claim 10, wherein said further imaging means is fixed to said head.

12. An apparatus according to claim 11, wherein said optical component has an additional position in which an additional optical path is defined between said further imaging means and said component when said component is held by said holding means.

13. An apparatus according to claim 11, further comprising a further optical component for defining a further optical path including said further component between said further imaging means and said component when said component is held by said holding means.

14. An apparatus according to claim 10, wherein said further imaging means is fixed to said base.

15. An apparatus for transporting a component, the apparatus comprising:
a base;
a head movable relative to said base;
holding means on said head for holding said component, said holding means includes a nozzle, wherein movement of said head causes a transportation of said component relative to said base when said component is held by said holding means;
an imaging means on said head for investigating said component when said component is held on said holding means;
only one optical component on said head for defining an optical path between said imaging means and said component when said component is held by said holding means; and
a further imaging means fixed to said base for investigating said component when said component is held on said holding means in a predetermined position relative to said base.

16. An apparatus according to claim 15, wherein said head is movable relative to said base so as to move said holding means from a position in which said component is in said predetermined position to an additional position.

17. An apparatus according to claim 16, wherein said base has means for supporting a board thereon and a selective position.

18. An apparatus according to claim 15, wherein said optical component is rotatable from said operating position to a board-viewing position, in which board-viewing position an additional optical path is defined between said imaging means and said selected position through said optical component.

19. An apparatus according to claim 18, wherein said head is connected to said base through a two-axis orthogonal robot.

20. An apparatus according to claim 19, wherein said imaging means is a camera.

21. An apparatus according to claim 20, further comprising a controller for controlling movement of at least said head and said optical component.

22. An apparatus according to claim 21, further including storage means on said base for storing a plurality of electrical components, and wherein any of said electrical components correspond to the components to be transported by said apparatus.

23. An apparatus according to one of claims 17, 18 or 19, wherein said component is held in a component store on said base prior to being held by said holding means.

24. An apparatus according to one of claims 17, 18, or 19, wherein said base supports a board, and said component is transported to said board subsequent to the investigation of said component by one of said first and said further imaging apparatus.

25. A method according to claim 24, wherein said optical component is movable to a further position in which an optical path is defined between said first imaging apparatus and said board through said optical component during the transportation of said component to said board.

26. A method of transporting a component using a transportation apparatus comprising a base, a head, holding means on said head, a first imaging apparatus on said head and having a narrow angle of view, and a further imaging apparatus having a wide angle of view, the method comprising the steps of:
holding said component on said holding means;
moving said head relative to said base to thereby transport said component;

determining whether said component is greater than a predetermined size;

investigating said component using said first imaging apparatus when said component is less than said predetermined size; and investigating said component using said further imaging apparatus when said component is greater than said predetermined size.

27. A method of transporting a component using a transportation apparatus comprising a base, a head, holding means on said head, a first imaging apparatus on said head, and a further imaging apparatus fixed to said base, the method comprising the steps of:

holding said component on said holding means;

moving said head relative to said base to thereby transport the component;

determining whether said component is greater than a predetermined size;

investigating said component using said first imaging apparatus when said component is less than said predetermined size;

investigating said component using said further imaging apparatus when said component is greater than said predetermined size.

28. An apparatus for transporting a component, the apparatus comprising;

a base;

a head movable relative to said base;

holding means on said head for holding said component, wherein movement of said head relative to said base in a first direction causes a transportation of said component relative to said base when said component is held by said holding means;

an imaging means fixed on said head for optically investigating said component when said component is held by said holding means; and at least one optical component on said head for defining an optical path between said imaging means and said component when said component is held by said holding means; and wherein said imaging means is fixed to said head and said at least one optical component is movable relative to said imaging apparatus between an operating position in which said optical path is defined between said imaging apparatus and said component when said component is held by said holding means and a withdrawn position, and wherein a further imaging means is fixed to said base for investigating said component when said component is held on the holding means in a predetermined position relative to said base.

29. An apparatus for transporting a component, the apparatus comprising:

a base;

a head movable relative to said base;

holding means on said head for holding said component, wherein movement of said head relative to said base in a first direction causes a transportation of said component relative to said base when said component is held by said holding means;

an imaging means fixed on said head for optically investigating said component when said component is held by said holding means; and at least one optical component on said head for defining an optical path between said imaging means and said component when said component is held by said holding means, and wherein said imaging means is fixed to said head, and said at least one optical component is movable relative to said imaging apparatus between an operating position in which said optical path is defined between said imaging apparatus and said component when said component is held by said holding means and a withdrawn position, wherein said optical component is linearly movable in a plane substantially perpendicular to said first direction, and wherein a further imaging means is fixed to said base for investigating said component when said component is held on the holding means in a predetermined position relative to said base.

30. An apparatus for transporting a component, the apparatus comprising:

a base;

a head movable relative to said base;

holding means on said head for holding said component, wherein movement of said head relative to said base in a first direction causes a transportation of said component relative to said base when said component is held by said holding means;

an imaging means fixed on said head for optically investigating said component when said component is held by said holding means; and at least one optical component on said head for defining an optical path between said imaging means and said component when said component is held by said holding means, and wherein said imaging means is fixed to said head, and said at least one optical component is movable relative to said imaging apparatus between an operating position in which said optical path is defined between said imaging apparatus and said component when said component is held by said holding means and a withdrawn position, wherein said optical component is linearly movable in a plane substantially perpendicular to said first direction, wherein said imaging means has a narrow angle of view, and wherein said apparatus further comprises a further imaging means having a wide angle of view for further investigating said component when said component is held by the holding means.

31. An apparatus for transporting a component, the apparatus comprising:

a base;

a head movable relative to said base;

holding means on said head for holding said component, wherein movement of said head relative to said base in a first direction causes a transportation of said component relative to said base when said component is held by said holding means;

an imaging means fixed on said head for optically investigating said component when said component is held by said holding means; and at least one optical component on said head for defining an optical path between said imaging means and said component when said component is held by said holding means, wherein said imaging means is fixed to said head, and said at least one optical component is movable relative to said imaging apparatus between an operating position in which said optical path is defined between said imaging apparatus and said component when said component is held by said holding means and a withdrawn position, wherein said optical component is linearly movable in a plane substantially perpendicular to said first direction, wherein said imaging means has a narrow angle of view, wherein said apparatus further comprises a further imaging means having a wide angle of view for investigating said component when said component is held by the holding means, with said further imaging means being fixed to said base.

* * * * *